(12) United States Patent
Chern et al.

(10) Patent No.: US 8,698,566 B2
(45) Date of Patent: Apr. 15, 2014

(54) PHASE LOCKED LOOP CALIBRATION

(75) Inventors: Chan-Hong Chern, Palo Alto, CA (US);
Ming-Chieh Huang, San Jose, CA (US);
Tao Wen Chung, San Jose, CA (US);
Chih-Chang Lin, San Jose, CA (US);
Fu-Lung Hsueh, Kaohsiung (TW);
Yuwen Swei, Fremont, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/252,498

(22) Filed: Oct. 4, 2011

(65) Prior Publication Data

US 2013/0082754 A1    Apr. 4, 2013

(51) Int. Cl.
*H03L 7/085* (2006.01)
*H03L 7/10* (2006.01)
*H03B 5/12* (2006.01)

(52) U.S. Cl.
USPC ......... 331/10; 332/117 FE; 332/36 C; 332/16

(58) Field of Classification Search
CPC .................................................. H03L 2207/50
USPC ............ 331/10, 16, 36 C, 117 R, 167, 177 V, 331/117 FE, 179
See application file for complete search history.

(56) References Cited

U.S. PATENT DOCUMENTS

| | | | |
|---|---|---|---|
| 7,268,630 B2 * | 9/2007 | Rhee et al. | 331/16 |
| 7,711,340 B2 * | 5/2010 | Kim et al. | 455/260 |
| 8,217,729 B2 * | 7/2012 | Chern et al. | 331/167 |
| 2006/0097772 A1 * | 5/2006 | Sakiyama et al. | 327/536 |
| 2008/0144252 A1 * | 6/2008 | Abadeer et al. | 361/277 |

FOREIGN PATENT DOCUMENTS

GB    2242796 A    * 10/1991 ................ H03L 7/08

OTHER PUBLICATIONS

Tiggelman,M.P.J., On the Trade-Off Between Quality Factor and Tuning Ratio in Tunable High-Frequency Capacitors, Sep. 2009, IEEE transactions on Electron Devices, vol. 56 Issue 9, 2128-2136.*
Sedra et al., "Microelectronic Circuits", 5th edition, Oxford University Press, Incorporated, 2004, :ISBN: 0195221389, 9780195221381, pp. 925-927.*

* cited by examiner

*Primary Examiner* — Ryan Johnson
(74) *Attorney, Agent, or Firm* — Lowe Hauptman & Ham, LLP

(57) ABSTRACT

An inductor-capacitor phase locked loop (LCPLL) includes an inductor-capacitor voltage controlled oscillator (LCVCO) that provides an output frequency. A calibration circuit includes two comparators and provides a coarse tune signal to the LCVCO. The two comparators respectively compare the loop filter signal with a first reference voltage and a second reference voltage that is higher than the first reference voltage to supply a first and second comparator output, respectively. The calibration circuit is capable of adjusting the coarse tune signal continuously in voltage values and adjusts the coarse tune signal based on the two comparator outputs. A loop filter provides a loop filter signal to the calibration circuit and a fine tune signal to the LCVCO. A coarse tune frequency range is greater than a fine tune frequency range.

20 Claims, 4 Drawing Sheets

PHASE LOCKED LOOP CALIBRATION

TECHNICAL FIELD

The present disclosure relates generally to a phase locked loop (PLL), and more particularly to the calibration of the PLL.

BACKGROUND

For a PLL with discrete frequency calibration points, the gain Kvco (frequency change vs. voltage change) and frequency coverage range of the PLL's Voltage Control Oscillator (VCO) vary significantly with process and voltage variations, such that each adjacent frequency tuning range may not overlap with each other (dead frequency zone). The PLL will fail to lock at the frequencies in the dead frequency zone. Also, a PLL having a high Kvco passes through input clock jitter and degrades the overall PLL noise/jitter performance.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
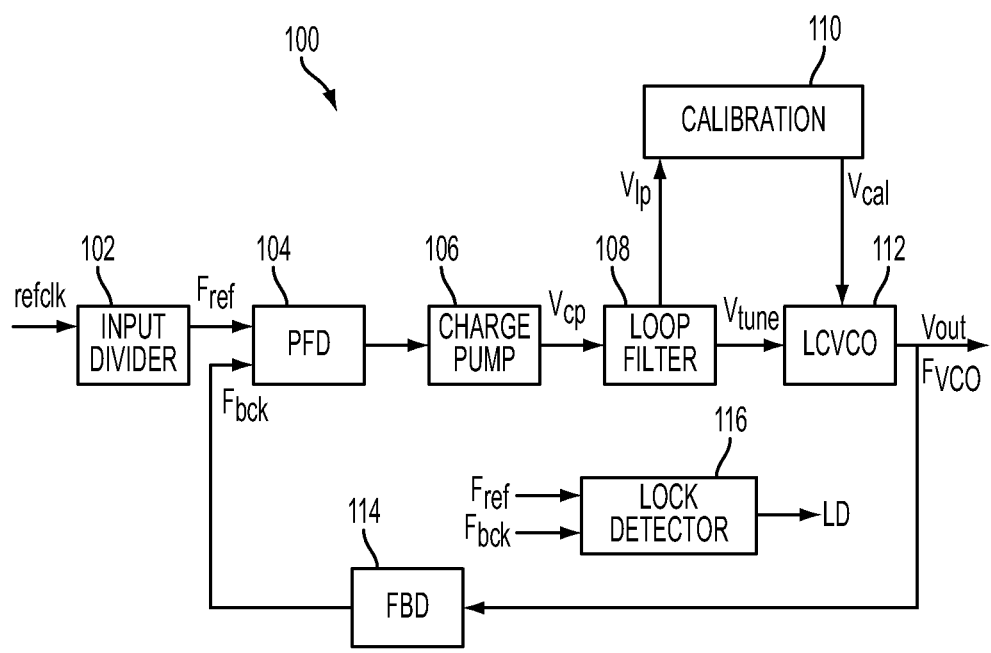
FIG. 1 is a schematic diagram of an exemplary inductor-capacitor phase locked loop (LCPLL) with a calibration circuit according to some embodiments.

FIG. 1 is a schematic diagram showing an exemplary inductor-capacitor phase locked loop (LCPLL) with a calibration circuit according to some embodiments. The PLL 100 includes an input divider 102 that received a reference clock signal (refclk) and divides the reference clock signal, e.g., by a number in the range of 1-4, to supply a reference frequency Fref to a phase and frequency detector (PFD) 104. The input divider 102 allows a flexible input frequency of refclk. The PFD 104 sends a control signal to a charge pump 106 based on the frequency difference between the reference frequency Fref and feedback frequency Fbck. The charge pump 106 provides a charge pump voltage output Vcp to the loop filter 108.

The loop filter 108 provides a filtered output Vtune to an inductor-capacitor voltage controlled oscillator (LCVCO) 112 that generates a VCO frequency Fvco. The LCVCO is suitable for the PLL 100 with relatively low Kvco in some embodiments. The loop filter 108 also provides another filtered output Vlp to a calibration circuit 110. The calibration circuit 110 provides a coarse tune signal Vcal to the LCVCO 112. The Vtune is used as a fine tune signal for the LCVCO 112.

The output frequency Fvco of LCVCO 112 is controlled by the signals Vcal and Vtune. The Fvco range ΔFcoarse controlled by the coarse tune signal Vcal includes the entire frequency specification range ΔFvco of the LCVCO 112 in some embodiments. The Fvco range ΔFfine controlled by the fine tune signal Vtune covers a portion of the ΔFvco and/or ΔFcoarse (i.e., ΔFfine<ΔFcoarse). For example, ΔFcoarse=ΔFvco=4 GHz (from 6 GHz to 10 GHz), and ΔFfine=0.4 GHz as shown in FIG. 2.

The Fvco is supplied to a feedback divider (FBD) 114. The FBD 114 receives the Fvco from LCVCO 112 and divides the Fvco frequency to supply a divided frequency Fbck to the PFD 104. A lock detector 116 detects if Fbck is locked to Fref and generates a lock detect signal LD. In one example, the refclk frequency is 100 MHz, and the input divider 102 divides it by 4, thus providing Fref at 25 MHz. The output frequency Fvco is 10 GHz, and the FBD 114 divides Fvco by 400 to provide Fbck at 25 MHz. In other embodiments, the input divider 102 is not included in the PLL 100.

Figure 2:
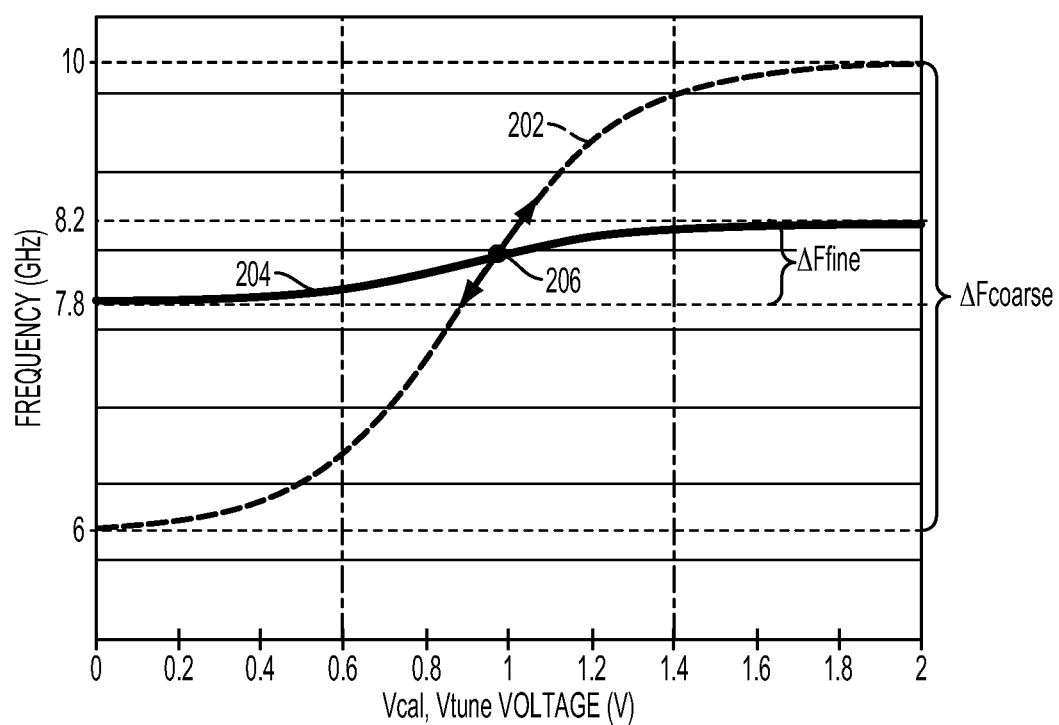
FIG. 2 is a plot of output frequency of the exemplary LCPLL in FIG. 1 for varying voltages of Vcal and Vtune according to some embodiments.

FIG. 2 is a plot of output frequency of the exemplary inductor-capacitor phase locked loop (LCPLL) in FIG. 1 for varying voltages of Vcal and Vtune according to some embodiments. A waveform 202 shows the output frequency Fvco vs. Vcal. Another waveform 204 shows the output frequency Fvco vs. Vtune. A pivot point 206 shows where the waveforms 202 and 204 coincide. The Vtune waveform 204 can be shifted up or down as the pivot point 206 is adjusted by Vcal along the Vcal waveform 202.

The pivot point 206 is set by Vcal, and the Fvco can be adjusted from the pivot point 206 within the frequency range ΔFfine by adjusting the Vtune (fine tune signal). In this example, from the pivot point 206, Fvco can be adjusted in the frequency range of about 7.8-8.2 GHz (ΔFfine=0.4 GHz). The pivot point can be adjusted within the frequency range ΔFcoarse by adjusting the Vcal (coarse tune signal). In this example, the pivot point 206 of Fvco can be adjusted within the frequency range of about 6-10 GHz (ΔFcoarse=4 GHz). The ΔFcoarse is significantly larger than the ΔFfine. The ΔFcoarse includes the whole frequency range of Fvco in some embodiments.

The calibration circuit 110 combats locking issue of LCPLL 100 from process, voltage, and temperature (PVT) variations by adjusting the coarse tune signal Vcal continuously in voltage values to provide the pivot point 206 that can cover the whole frequency specification range of the LCPLL 100 without dead frequency zone.

Figure 3:
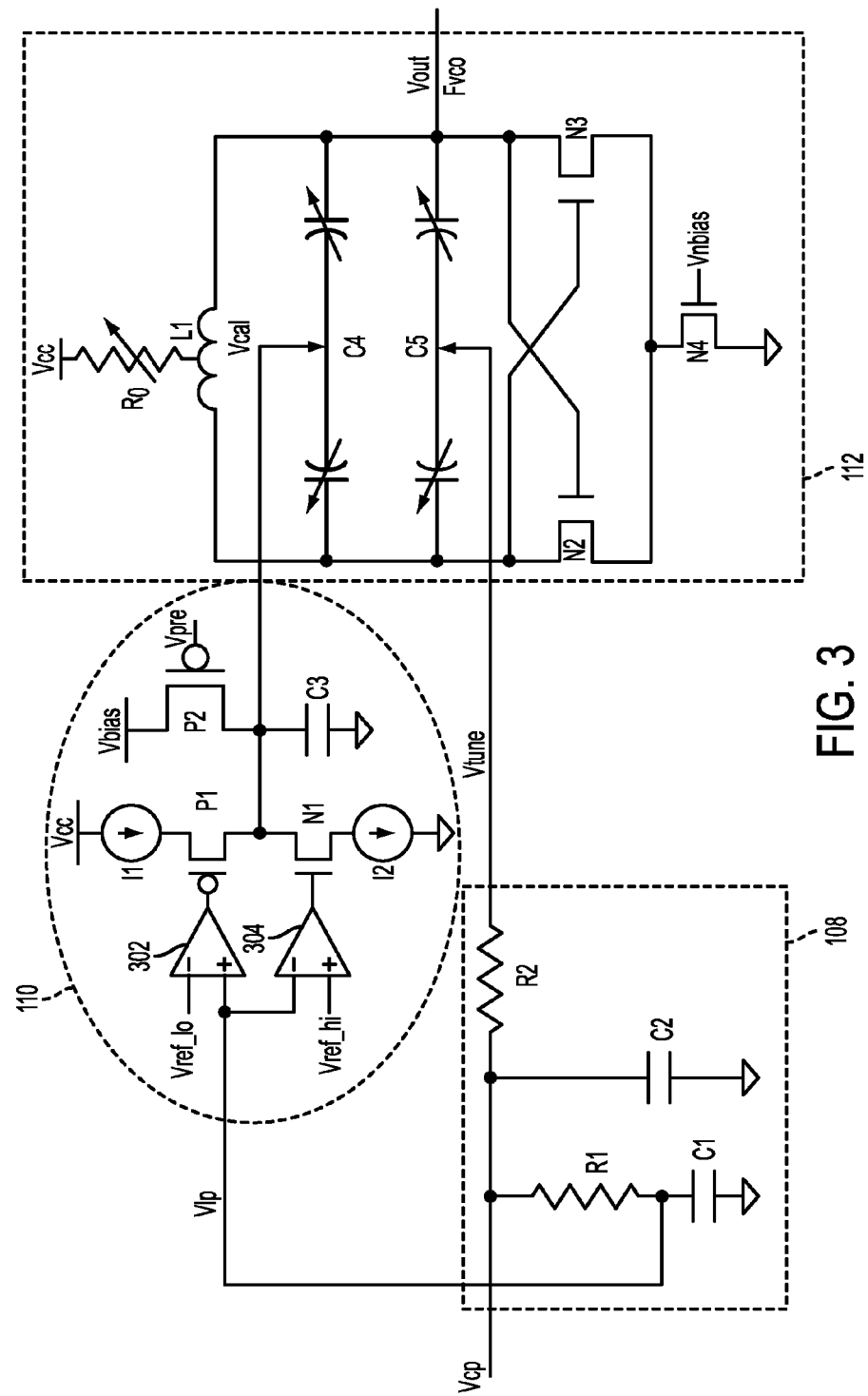
FIG. 3 is a schematic diagram of the calibration circuit of the exemplary LCPLL in FIG. 1 according to some embodiments.

FIG. 3 is a schematic diagram of the calibration circuit of the exemplary inductor-capacitor phase locked loop (LCPLL) in FIG. 1 according to some embodiments. The LCVCO 112 includes an inductor L1 coupled to a power supply Vcc through a variable resistor R0. The variable resistor R0 can adjust output common-mode voltage in the LCVCO 112 according to the tail current provided by transistor N4. The inductor L1 is coupled to varactors (variable capacitors) C4 and C5. Negative Metal Oxide Semiconductor (NMOS) transistors N2 and N3 in the LCVCO 112 helps the LCVCO 112 to have negative resistance characteristics, and an NMOS transistor N4 adjusts the current through the LCVCO by Vnbias.

The loop filter 108 includes two resistors R1 and R2, and two capacitors C1 and C2. In some embodiments, C1 is at least 10 times of C2, e.g., C1 is about 20-50 pF when C2 is about 2-5 pF, which allows Vlp to have less ripples than Vtune. The Vtune is used to tune the varactor (variable capacitor) C5 in the LCVCO 112. In some embodiments, R1 is about 4-8 kΩ, when R2 is 1 kΩ. In other embodiments, Vtune from the loop filter 108 can be also supplied as Vlp to the calibration circuit 110.

The calibration circuit 110 includes two comparators 302 and 304 to detect and determine if the fine-tune frequency range (ΔFfine) from the current pivot point 206 is able to meet the intended Fvco frequency, so that the LCPLL 100 can lock. If not, Fvco is continuously increased or decreased by adjusting the coarse tune signal Vcal to change the pivot point 206. The comparators 302 and 304 can be implemented using op-amps in some embodiments.

The comparator 302 compares the Vlp with a low reference voltage Vref_lo, while the comparator 304 compares the Vlp with a high reference voltage Vref_high in the calibration circuit 110. The Vref_lo and Vref_high can be set based on the change of Fvco from the Vtune change and device overstress considerations. For example, Vref_lo can be set to correspond to Vtune voltage of 0.6 V in FIG. 2, and Vref_high can be set to correspond to Vtune voltage of 1.4 V in FIG. 2, because the Fvco change (tuning effect) from Vtune (fine tune) is most significant between 0.6 V and 1.4 V. Also, selecting the Vref_lo and Vref_high not to put a high voltage on the varactor C5 will prevent overstressing the device.

If the Vlp is lower than Vref_lo in comparator 302, a pull up PMOS transistor P1 (a pull up circuit) is turned on to pull up the Vcal voltage that adjusts the varactor C4 in the LCVCO 112. On the other hand, if the Vlp is higher than Vref_high in comparator 304, a pull down NMOS transistor N1 (a pull down circuit) is turned on to pull down the Vcal voltage that adjusts the varactor C4 in the LCVCO 112. The Vcal adjustment is continuous (i.e., not discrete). If the Vcal is increased, the Fvco pivot point will also increases along the waveform 202, and if the Vcal is decreased, the Fvco pivot point will also decreases along the waveform 202. The Fvco also increases or decreases with Vtune along the waveform 204.

For comparison, for a circuit that adjusts Vcal at discrete steps (i.e., not continuous), there could be certain process and/or power supply voltage conditions that the fine tune frequency range (ΔFfine) is disjoint from the neighboring fine tune frequency range because of the discrete Vcal points, and some Fvco frequency values are not covered. In contrast, for the LCPLL having the calibration circuit 110 can continuously adjust the coarse tune signal Vcal (thus the pivot point 206). Also, the fine tune frequency range (ΔFfine) can be a relatively small portion of the ΔFcoarse and does not have to be greater than certain values. Thus the gain Kvco of the PLL 100 can be smaller than other circuits to have a better noise performance.

The current sources I1 and I2 provides constant current when the Positive Metal Oxide Semiconductor (PMOS) transistor P1 or NMOS transistor N1 is turned on, respectively. A PMOS transistor P2 (precharge circuit) is used to precharge (preset) the Vcal (coarse tune signal) to a bias voltage Vbias by applying Vpre signal for a preset duration to the gate of the PMOS transistor P2 (e.g., turn on the PMOS transistor P2 by a logical 0 for a preset duration) in some embodiments. This sets the pivot point 206 in FIG. 2 to a desired point, and the LCVCO 112 oscillates at a pre-determined Fvco frequency for the PLL 100 in FIG. 1 to lock. A capacitor C3 helps to maintain the Vcal after the Vpre signal is turned off (e.g., turn off the PMOS transistor P2 by a logical 1).

Figure 4:
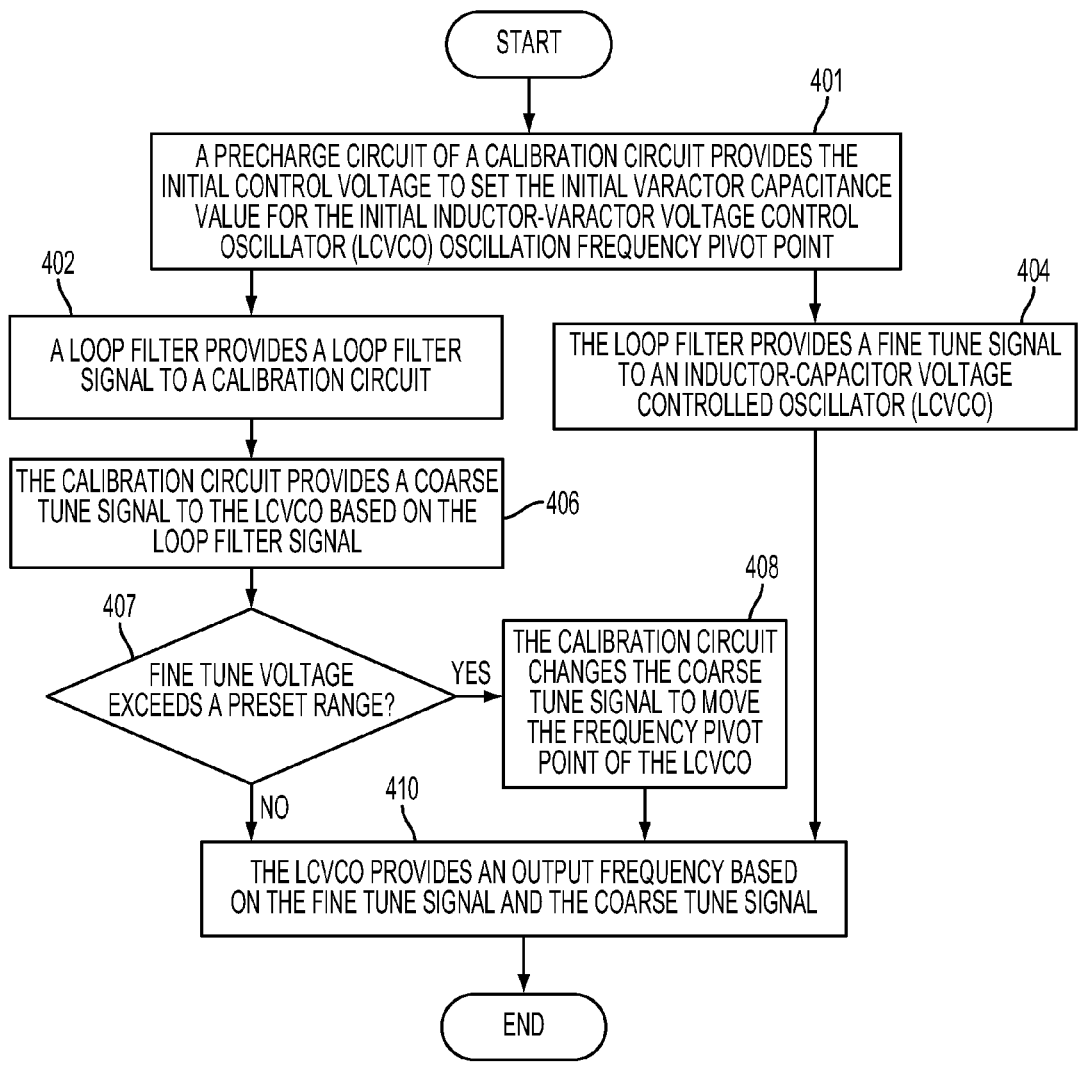
FIG. 4 is a flowchart of a method of controlling the output frequency of the exemplary LCPLL in FIG. 1 according to some embodiments.

FIG. 4 is a flowchart of a method of controlling the output frequency of the exemplary LCPLL in FIG. 1 according to some embodiments. At step 401, a precharge circuit of a calibration circuit provides the initial control voltage to set the initial varactor capacitance value for the initial inductor-varactor voltage control oscillator (LCVCO) oscillation frequency pivot point. At step 402, a loop filter provides a loop filter signal to a calibration circuit. At step 404, the loop filter provides a fine tune signal to the LCVCO. At step 406, the calibration circuit provides a coarse tune signal to the LCVCO based on the loop filter signal. The calibration circuit is capable of continuously adjusting the coarse tune signal in voltage values.

At step 407, the calibration circuit determines whether the fine tune voltage exceeds a preset voltage range. At step 408, the calibration circuit changes the coarse tune voltage to move the frequency pivot point of the LCVCO up or down based on LCVCO oscillation frequency requirement of the PLL loop. At step 410, the LCVCO provides an output frequency based on the fine tune signal and the coarse tune pivot signal. A coarse tune frequency range that is the maximum output frequency change based on the coarse tune signal is greater than a fine tune frequency range that is the maximum output frequency change based on the fine tune signal.

In various embodiments, a first comparator in the calibration circuit compares the loop filter signal with a first reference voltage. A pull-up circuit in the calibration circuit is turned on in order to increase the coarse tune signal if the loop filter signal is lower than the first reference voltage. A second comparator in the calibration circuit compares the loop filter signal with a second reference voltage that is higher than the first reference voltage. A pull-down circuit in the calibration circuit is turned on in order to decrease the coarse tune signal if the loop filter signal is higher than the second reference voltage. The LCVCO increases the output frequency if the coarse tune signal or the fine tune signal is increased. The LCVCO decreases the output frequency if the coarse tune signal or fine tune signal is decreased. The coarse tune signal is set to a preset voltage by a precharge circuit.

In various embodiments, a phase frequency detector (PFD) detects a difference between a feedback frequency derived from the output frequency and a reference frequency. A charge pump (CP) receives a PFD output from the PFD. The charge pump supplies a CP voltage signal to the loop filter. A feedback divider (FBD) divides the output frequency. The FBD supplies the divided output frequency to the PFD. An input divider divides an input frequency. The input divider supplies the divided input frequency to the PFD. A first variable capacitor in the LCVCO is controlled by the coarse tune signal. A second variable capacitor in the LCVCO is controlled by the fine tune signal.

According to some embodiments, a phase locked loop (PLL) includes an inductor-capacitor voltage controlled oscillator (LCVCO) that provides an output frequency. A calibration circuit includes two comparators and provides a coarse tune signal to the LCVCO. The two comparators respectively compare the loop filter signal with a first reference voltage and a second reference voltage that is higher than the first reference voltage to supply a first and second comparator output. The calibration circuit is capable of adjusting the coarse tune signal continuously in voltage values and adjusts the coarse tune signal based on the two comparator outputs. A loop filter provides a loop filter signal to the calibration circuit and a fine tune signal to the LCVCO. A coarse tune frequency range, i.e., the maximum output frequency change from the coarse tune signal, is significantly greater than a fine tune frequency range, i.e., the maximum output frequency change from the fine tune signal.

According to some embodiments, a loop filter provides a loop filter signal to a calibration circuit. The loop filter provides a fine tune signal to an inductor-capacitor voltage controlled oscillator (LCVCO). The calibration circuit provides a coarse tune signal to the LCVCO based on the loop filter signal. The calibration circuit is capable of continuously adjusting the coarse tune signal in voltage values. The LCVCO provides an output frequency based on the fine tune signal and the coarse tune signal. A coarse tune frequency range that is the maximum output frequency change based on the coarse tune signal is significantly greater than a fine tune frequency range that is the maximum output frequency change based on the fine tune signal.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiments of the disclosure. Embodiments that combine different claims and/or different embodiments are within the scope of the disclosure and will be apparent to those skilled in the art after reviewing this disclosure.

What is claimed is:

1. A phase locked loop (PLL), comprising:
    an inductor-capacitor voltage controlled oscillator (LCVCO) arranged to provide an output frequency;
    a calibration circuit arranged to provide a coarse tune signal to the LCVCO, the calibration circuit including a first comparator and a second comparator; and
    a loop filter configured to provide a loop filter signal to the calibration circuit and a fine tune signal to the LCVCO,
    wherein the first comparator is configured to compare the loop filter signal with a first reference voltage to supply a first comparator output, the second comparator is configured to compare the loop filter signal with a second reference voltage that is higher than the first reference voltage to supply a second comparator output, the calibration circuit configured to adjust the coarse tune signal based on the first comparator output and the second comparator output, the calibration circuit is capable of adjusting the coarse tune signal to any voltage value within a continuous range of voltage values corresponding to a coarse tune frequency range, and the coarse tune frequency range is the maximum output frequency change from the coarse tune signal and is greater than a fine tune frequency range that is the maximum output frequency change from the fine tune signal.

2. The PLL of claim 1, wherein the coarse tune signal is arranged to be initially set to a preset voltage by a precharge circuit.

3. The PLL of claim 2, wherein the precharge circuit comprises a PMOS transistor.

4. The PLL of claim 1, further comprising a phase frequency detector (PFD) configured to detect a difference between a feedback frequency derived from the output frequency and a reference frequency.

5. The PLL of claim 4, further comprising a charge pump (CP) arranged to receive a PFD output from the PFD and to supply a CP voltage signal to the loop filter.

6. The PLL of claim 4, further comprising a feedback divider (FBD) configured to divide the output frequency and to supply the divided output frequency as the feedback frequency to the PFD.

7. The PLL of claim 4, further comprising an input divider configured to divide an input frequency and to supply the divided input frequency to the PFD as the reference frequency.

8. The PLL of claim 1, wherein the LCVCO comprising a first variable capacitor controlled by the coarse tune signal and a second variable capacitor controlled by the fine tune signal.

9. The PLL of claim 1, wherein the calibration circuit further comprises a pull-up circuit and a pull-down circuit to adjust the coarse tune signal.

10. A method of controlling an output frequency of a phase locked loop (PLL), comprising:
    providing, by a loop filter, a loop filter signal to a calibration circuit;
    providing, by the loop filter, a fine tune signal to an inductor-capacitor voltage controlled oscillator (LCVCO);
    providing, by the calibration circuit, a coarse tune signal to the LCVCO based on the loop filter signal, wherein the calibration circuit is capable of adjusting the coarse tune signal to any voltage value within a continuous range of voltage values corresponding to a coarse tune frequency range;
    comparing, using a first comparator in the calibration circuit, the loop filter signal with a first reference voltage;
    providing, by the LCVCO, an output frequency based on the fine tune signal and the coarse tune signal, wherein the coarse tune frequency range is the maximum output frequency change based on the coarse tune signal and is greater than a fine tune frequency range that is the maximum output frequency change based on the fine tune signal; and
    detecting, by a phase frequency detector (PFD), a difference between a feedback frequency derived from the output frequency and a reference frequency.

11. The method of claim 10, further comprising:
    turning on a pull-up circuit in the calibration circuit in order to increase the coarse tune signal if the loop filter signal is lower than the first reference voltage.

12. The method of claim 11, further comprising:
    comparing, using a second comparator in the calibration circuit, the loop filter signal with a second reference voltage that is higher than the first reference voltage; and
    turning on a pull-down circuit in the calibration circuit in order to decrease the coarse tune signal if the loop filter signal is higher than the second reference voltage.

13. The method of claim 10, further comprising:
    increasing, by the LCVCO, the output frequency if the coarse tune signal or the fine tune signal is increased; and
    decreasing, by the LCVCO, the output frequency if the coarse tune signal or fine tune signal is decreased.

14. The method of claim 10, further comprising setting the coarse tune signal to a preset voltage by a precharge circuit.

15. The method of claim 10, wherein providing the fine tune signal to the LCVCO comprises providing the fine tune signal directly from the loop filter to the LCVCO.

16. The method of claim 15, further comprising:
receiving, by a charge pump (CP), a PFD output from the PFD; and
supplying, by the charge pump, a CP voltage signal to the loop filter.

17. The method of claim 10, further comprising:
dividing, using a feedback divider (FBD), the output frequency; and
supplying, by the FBD, the divided output frequency as the feedback frequency to the PFD.

18. The method of claim 15, further comprising:
dividing, using an input divider, an input frequency; and
supplying, by the input divider, the divided input frequency to the PFD.

19. The method of claim 10, further comprising:
controlling a first variable capacitor in the LCVCO by the coarse tune signal; and
controlling a second variable capacitor in the LCVCO by the fine tune signal.

20. A phase locked loop (PLL), comprising:
an inductor-capacitor voltage controlled oscillator (LCVCO) arranged to provide an output frequency;
a feedback divider (FBD) configured to divide the output frequency and to supply the divided output frequency as a feedback frequency;
a phase frequency detector (PFD) configured to detect a difference between the feedback frequency and a reference frequency;
a calibration circuit arranged to provide a coarse tune signal to the LCVCO, the calibration circuit including a first comparator and a second comparator;
a loop filter configured to provide a loop filter signal to the calibration circuit and a fine tune signal to the LCVCO;
a charge pump (CP) arranged to receive a PFD output from the PFD and to supply a CP voltage signal to the loop filter; and
a precharge circuit configured to initially set the coarse tune signal to a preset voltage,
wherein the calibration circuit is capable of adjusting the coarse tune signal to any voltage value within a continuous range of voltage values corresponding to a coarse tune frequency range, the first comparator is configured to compare the loop filter signal with a first reference voltage to supply a first comparator output, the second comparator is configured to compare the loop filter signal with a second reference voltage that is higher than the first reference voltage to supply a second comparator output, the calibration circuit configured to adjust the coarse tune signal based on the first comparator output and the second comparator output, and the coarse tune frequency range is the maximum output frequency change from the coarse tune signal and is greater than a fine tune frequency range that is the maximum output frequency change from the fine tune signal.

* * * * *